(12) United States Patent
Choi et al.

(10) Patent No.: US 9,754,702 B2
(45) Date of Patent: Sep. 5, 2017

(54) ELECTRODE STRUCTURE AND METHOD FOR PRODUCING ELECTRODE

(75) Inventors: Joon Rak Choi, Seoul (KR); Jong Woon Moon, Seoul (KR); Young Sun You, Seoul (KR); Kyoung Hoon Chai, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/235,669

(22) PCT Filed: Jul. 25, 2012

(86) PCT No.: PCT/KR2012/005938
§ 371 (c)(1),
(2), (4) Date: May 7, 2014

(87) PCT Pub. No.: WO2013/015612
PCT Pub. Date: Jan. 31, 2013

(65) Prior Publication Data
US 2014/0285736 A1    Sep. 25, 2014

(30) Foreign Application Priority Data
Jul. 28, 2011   (KR) .......................... 10-2011-0075470

(51) Int. Cl.
*H01B 5/14* (2006.01)
*G06F 3/041* (2006.01)
(Continued)

(52) U.S. Cl.
CPC ................ *H01B 5/14* (2013.01); *B82Y 30/00* (2013.01); *G02F 1/13439* (2013.01);
(Continued)

(58) Field of Classification Search
CPC .......... H05K 1/09; H05K 1/092; H05K 1/097; H01L 31/0224; H01L 31/042;
(Continued)

(56) References Cited

U.S. PATENT DOCUMENTS

2003/0044608 A1* 3/2003 Yoshizawa ................ B32B 9/00
428/398
2008/0088219 A1   4/2008 Yoon et al.
(Continued)

FOREIGN PATENT DOCUMENTS

| CN | 101689568 A | 3/2010 |
|----|-------------|--------|
| CN | 101971354 A | 2/2011 |

(Continued)

OTHER PUBLICATIONS

Office Action dated Jul. 17, 2014 in Taiwanese Application No. 101127153.
(Continued)

*Primary Examiner* — Jennifer Mehmood
*Assistant Examiner* — Sardis F Azongha
(74) *Attorney, Agent, or Firm* — Saliwanchik, Lloyd & Eisenschenk

(57) ABSTRACT

Disclosed are an electrode structure and a method for producing an electrode. The method includes disposing first and second wires on a substrate, and bonding the first and second wires to each other. The electrode structure includes a substrate, a first wire disposed on the substrate, and a second wire disposed on the substrate. The first wire crosses the second wire, and the first and second wires are bonded to each other.

12 Claims, 3 Drawing Sheets

(51) Int. Cl.
*B82Y 30/00* (2011.01)
*H01L 31/0224* (2006.01)
*G02F 1/1343* (2006.01)
*B82Y 40/00* (2011.01)

(52) U.S. Cl.
CPC ...... *G06F 3/041* (2013.01); *H01L 31/022466* (2013.01); *B82Y 40/00* (2013.01); *G02F 2202/36* (2013.01); *G06F 2203/04103* (2013.01)

(58) Field of Classification Search
CPC ............ H01L 31/022466; C09D 11/02; C09D 11/101; G06F 2203/04103; G06F 3/041; G02F 2202/36; G02F 1/13439; H01B 5/14; B82Y 30/00
See application file for complete search history.

(56) References Cited

U.S. PATENT DOCUMENTS

| | | | |
|---|---|---|---|
| 2008/0143906 A1* | 6/2008 | Allemand et al. | 349/43 |
| 2008/0176042 A1 | 7/2008 | Nashiki et al. | |
| 2008/0259262 A1 | 10/2008 | Jones et al. | |
| 2009/0223703 A1* | 9/2009 | Winoto | 174/257 |
| 2009/0321113 A1 | 12/2009 | Allemand et al. | |
| 2010/0266956 A1* | 10/2010 | Naoi et al. | 430/285.1 |
| 2011/0089160 A1* | 4/2011 | Kuriki | H05B 3/84 219/553 |

FOREIGN PATENT DOCUMENTS

| | | |
|---|---|---|
| EP | 1914781 A2 | 4/2008 |
| JP | 2009224078 A | 10/2009 |
| KR | 10-2010-0017128 A | 2/2010 |
| KR | 10-2010-0125315 A | 11/2010 |
| KR | 10-2011-0070541 A | 6/2011 |
| TW | 2011-19867 A | 6/2011 |

OTHER PUBLICATIONS

International Search Report in International Application No. PCT/KR2012/005938, filed Jul. 25, 2012.
Liangbing Hu et al. "Scalable Coating and 1-11 Properties of Transparent, Flexible, Silver Nanowire Electrodes" ACS Nano, vol. 4:5, May 20, 2010, pp. 2955-2963, XP055043061.
Yugang Sun et al. "Crystalline Silver Nanowires by Soft Solution Processing" Nano Letters, American Chemical Society, US, vol. 2:2, Jan. 3, 2002, pp. 165-168, XP008072569.
Anuj 4 Madaria et al. "Large scale, highly conductive and patterned transparent films of silver nanowires on arbitrary substrates and their application in touch screens; large scale, highly conductive and patterned transparent films of silver nanowires on arbitrary substrate and its application in touch screen" Nanotechnology, IOP, Bristol, GB, vol. 22: 24, Apr. 20, 2011, p. 245201, XP020205476.
Whitney Gaynor et al. "Fully Solution-Processed Inverted Polymer Solar Cells with Laminated Nanowire Electrodes" ACS Nano, vol. 4: 1, Jan. 26, 2010, pp. 30-34, XP055142451.
European Search Report dated Mar. 6, 2015 in European Application No. 12817451.3.
Office Action dated Jul. 28, 2015 in Chinese Application No. 201280047780.4.

* cited by examiner

ELECTRODE STRUCTURE AND METHOD FOR PRODUCING ELECTRODE

CROSS-REFERENCE TO RELATED APPLICATIONS

This application is the U.S. national stage application of International Patent Application No. PCT/KR2012/005938, filed Jul. 25, 2012, which claims priority to Korean Application No. 10-2011-0075470, filed Jul. 28, 2011, the disclosures of each of which are incorporated herein by reference in their entirety.

TECHNICAL FIELD

The embodiment relates to an electrode structure and a method for producing an electrode.

BACKGROUND ART

A transparent electrode including transparent material has been applied to electronic products such as a display device, a solar cell, and a mobile device. Researches and studies on a nanowire, which serves as the transparent conductive material for the transparent electrode and has a wire-shape structure in a nanometer size, have been actively carried out.

Since the nanowire has superior electrical conductivity, flexibility, and transmittance, the transparent electrode can represent superior characteristics However, when producing the transparent electrode, if an amount of used conductive nanomaterials is reduced, optical characteristics such as transmittance and haze can be improved, but electrical characteristics may be degraded. In contrast, if an amount of used nanomaterials is increased, the electrical characteristics can be improved, but the optical characteristics may be degraded.

According to the related art, nanowires are coated on the substrate as follows.

First, a plurality of nanowires is prepared. The nanowires may be prepared through a liquid phase scheme, a vapor phase scheme, or an electrochemical growing scheme using templates. For example, a scheme of preparing the nanowires through the liquid phase scheme includes a step of heating a solvent, a step of adding a capping agent to the solvent, a step of preparing a plurality of seed particles in the solvent, a step of adding a metallic compound to the solvent, a step of additionally adding a room-temperature solvent to the solvent, and a step of refining nanowires.

The nanowires prepared through the scheme may be disposed on a substrate. In this case, after the nanowires have been disposed on the substrate, the nanowires may be bonded to the substrate by applying a pressure thereto.

However, in the electrode structure produced through the above method, the surface resistance between the nanowires and the substrate is increased, so that the electrical characteristics may be lowered.

Therefore, the method for producing the electrode structure capable of reducing the surface resistance of the nanowires and the electrode structure produced through the method are required.

In addition, a method of capable of reducing the surface resistance through the post treatment after coating the nanowires on the substrate is required.

DISCLOSURE OF INVENTION

Technical Problem

The embodiment can provide an electrode structure capable of improving both of optical and electrical characteristics by bonding wires to each other through light treatment or heat treatment and a method for producing an electrode.

Solution to Problem

According to the embodiment, there is provided a method for producing an electrode. The method includes preparing first and second wires, disposing the first and second wires on a substrate, and bonding the first and second wires to each other.

According to the embodiment, there is provided an electrode structure. The electrode structure includes a substrate, a first wire on the substrate, and a second wire on the substrate. The first wire crosses the second wire, and the first wire is bonded to the second wire.

Advantageous Effects of Invention

As described above, according to the method for producing the electrode and the electrode structure of the embodiment, the wires crossing each other can be bonded to each other by performing light treatment and heat treatment with respect to the substrate having wires disposed therein. In this case, the wires are bonded to each other while crossing each other so that the surface resistance can be lowered. Therefore, the electrode structure can represent high electrical characteristics even if a small amount of wires are used.

In other words, the electrode produced through the method for producing the electrode according to the embodiment can maintain high transmittance, and can represent a low reflective index, high conductivity, high light transmittance, and low haze. In addition, since the electrode represents low surface resistance, the performance of the device employing the electrode can be improved.

MODE FOR THE INVENTION

Figure 1:
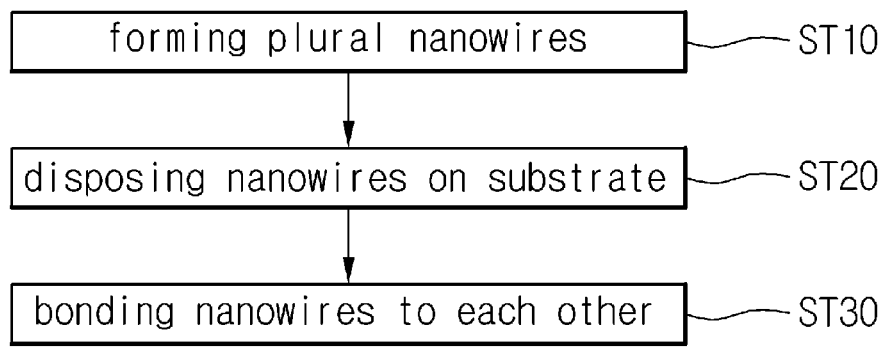
FIG. 1 is a flowchart showing a method for producing an electrode according to the present embodiment.

In the description of the embodiments, it will be understood that, when a layer (film), a region, a pattern, or a structure is referred to as being "on" or "under" another layer (film), another region, another pattern, or another substrate, it can be "directly" or "indirectly" on the other layer (film), region, pattern, or structure, or one or more intervening layers may also be present. Such a position of each layer has been described with reference to the drawings.

The thickness and size of each layer (film), region, pattern, or structure shown in the drawings may be exaggerated, omitted or schematically drawn for the purpose of convenience or clarity. In addition, the size of each layer (film), region, pattern, or structure does not utterly reflect an actual size.

Hereinafter, embodiments of the disclosure will be described in detail with reference to accompanying drawings.

Hereinafter, a method for producing an electrode according to the present embodiment will be described with reference to FIG. 1.

Referring to FIG. 1, the method for producing the electrode according to the embodiment includes a step of preparing a plurality of wires (step ST10), a step of disposing the wires on a substrate (step ST20), and a step of bonding the wires to each other (step ST30).

In the step of preparing a plurality of wires (step ST10), a plurality of wires, for example, first and second wires may be prepared.

In the step of preparing the wires, the wires may be prepared through a liquid phase scheme, a vapor phase scheme, or an electrochemical growing scheme using templates. For example, the step of preparing the wires through the liquid phase scheme may be performed as follows.

The step of preparing the wires (step ST10) may include a step of heating a solvent, a step of adding a capping agent to the solvent, a step of preparing a plurality of seed particles in the solvent, a step of adding a metallic compound to the solvent, a step of additionally adding a room-temperature solvent to the solvent, and a step of refining wires. The steps are not essential steps, parts of the steps may not be performed according to the manufacturing method, and the sequence of the steps may be changed.

In the step of heating the solvent, the solvent is heated at a reaction temperature suitable for the preparing of the metallic wires.

The solvent may include polyol. The polyol serves as a mile reducing agent while serving as a solvent of mixing different materials thereby helping the preparing of the metallic wires. The polyol may include ethylene glycol (EG), propylene glycol (PG), glycerine, glycerol or glucose. The reaction temperature may be variously adjusted by taking the type and the characteristics of the solvent and the metallic compound into consideration.

In the step of adding the capping agent to the solvent, the capping agent inducing the preparing of the wire is added to the solvent. If reduction for the preparing of the wire is rapidly performed, metals are aggregated, so that the wire shape may not be formed. Accordingly, the capping agent prevents the metals from being aggregated by properly dispersing materials contained in the solvent.

The capping agent may include various materials. For example, the capping agent may include material selected from the group consisting of polyvinylpyrrolidone (PVP), polyvinyl alcohol (PVA), cetyl trimethyl ammonium bromide (CTAB), cetyl trimethyl ammonium chloride (CTAC), and polyacrylamide (PAA).

Thereafter, in the step of adding the catalyst to the solvent, bay salt or refined salt is added as the catalyst. The bay salt or the refined salt includes various metals or halogen element together with NaCl to form a seed used to prepare a metallic wire or to accelerate the reaction of preparing the metallic wire. The various metals or the halogen element may include Mg, K, Zn, Fe, Se, Mn, P, Br, and I.

In the step of adding the metallic compound to the solvent, a reaction solution is formed by adding the metallic compound to the solvent. In this case, the metallic compound melted in a separate solvent may be added to the solvent having the capping agent and the catalyst. The separate solvent may include material identical to or different from material in the solvent used in the initial stage. The metallic compound may be added after a predetermined time elapses from a time in which the catalyst is added. Accordingly, a desirable reaction temperature can be stabilized.

In this case, the metallic compound includes a compound including metal used to prepare a desirable metallic wire. In order to prepare a silver wire, the metallic compound may include $AgCl$, $AgNO_3$ or $KAg(CN)_2$.

As described above, if the metallic compound is added to the solvent having the capping agent and the catalyst, reaction occurs so that the preparing of the metallic wire is started.

In the step of refining the wire, the metallic wire is refined and collected in another reaction solution for the refining of the wire.

The disclosure discloses the step of preparing the wires (step ST10) through a liquid phase scheme. However, the embodiment is not limited thereto. Accordingly, in the step of the preparing the wires (step ST10), the wires may be prepared through the liquid phase scheme, a vapor phase scheme, or an electrochemical growing scheme using templates.

In the step of preparing the wires (step ST10), third and fourth wires may be additionally prepared as well as the first and second wires. However, the embodiment is not limited thereto, and a plurality of wires may be prepared.

The wires prepared through the above steps may have a diameter in the range of about 10 nm to about 200 nm, and may have a length in the range of about 10 μm to about 100 μm.

Thereafter, the step of disposing the wires on the substrate (step ST20) may include a step of coating the first and second wires and a step of drying the substrate.

Before performing the coating step, a step of preparing electrode material by dispersing the wire in ethanol is performed. In other words, the electrode material prepared by dispersing the wire in a solution such as ethanol or water may be coated on the substrate. Accordingly, the wires can be coated on the substrate in the uniform dispersion state without being aggregated with each other. Therefore, the transmittance of the electrode including the wires can be improved, and the resistance can be lowered.

In coating step, a dip coating scheme may be performed. The dip coating scheme is one of coating schemes, and refers to a scheme of obtaining a coating film by baking a coated material at a desirable temperature after forming a precursor layer on the surface of the coated material by dipping the coated material into a coating solution or slurry.

However, the embodiment is not limited thereto. Accordingly, the coating step may be performed through various coating schemes such as a spin coating scheme, a flow coating scheme, a spray coating scheme, a slit die coating scheme, and a roll coating scheme.

Thereafter, the first and second wires may be disposed on the substrate by drying the coated substrate at the temperature of about 50° C. to about 150° C. for about one minute to about 30 minutes.

The third and fourth wires may be disposed on the substrate as well as the first and second wires. In other words, the first wire may cross the second and fourth wires, and the second wire may cross the first and third wires.

Thereafter, in the step of bonding the wires to each other (step ST30), the first and second wires may be bonded to each other.

The first wire may be bonded to the second wire while crossing the second wire. The first wire may be bonded to the second wire by performing light treatment or heat treatment with respect to the substrate on which the first and second wires are disposed.

The light treatment can be performed by irradiating light with energy of about 5 J to about 50 J onto the substrate. For example, the light treatment may be performed by using an IPL (Intense Pulsed Light) device. The IPL device is machine to periodically emit light having a strong wavelength.

The heat treatment may be performed by applying heat having a temperature of about 150° C. to about 300° C. to the substrate. For example, the heat treatment may be performed by heating the substrate at the temperature of about 150° C. or more for about 30 minutes after putting the substrate into a reaction chamber filled with reduction gas.

The first and second wires disposed on the substrate may be bonded to each other through the light treatment or the heat treatment. In other words, the first and second wires are bonded to each other so that the first and second wires can be integrally formed with each other.

According to the related art, the first and second wires are disposed on the substrate by applying a pressure to the substrate after coating the first and second wires on the substrate and drying the substrate. However, in this case, a high pressure is applied in order to enhance electrical characteristics, so that the base or the wire may be deformed.

However, according to the method for producing the electrode of the present embodiment, only the first and second wires are bonded to each other through the light treatment or the heat treatment, so that both of the electrical characteristics and the optical characteristics can be satisfied while using the small amount of nanomaterials. In other words, when comparing with electrodes according to the related art, about 30% to about 95% of the surface resistance can be reduced by bonding the wires to each other so that the wires easily make contact with each other. Preferably, the electrode produced according to the method for producing the electrode may have the surface resistance in the range of about 1000Ω/☐ to 1800Ω/☐. Therefore, according to the method for producing the electrode of the present embodiment, even if a small amount of nanomaterials are used, the surface resistance can be lowered. Accordingly, the electrode representing improved electrical characteristics, high light transmittance, and low haze can be produced.

Hereinafter, an electrode structure according to the present embodiment will be described in detail with reference to FIGS. 2 to 7.

Figure 2:
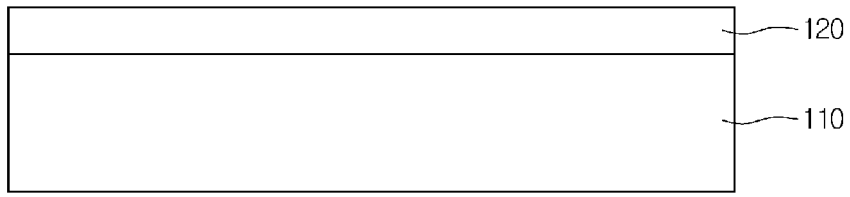
FIG. 2 is a plan view showing an electrode structure according to the present embodiment.
Figure 3:
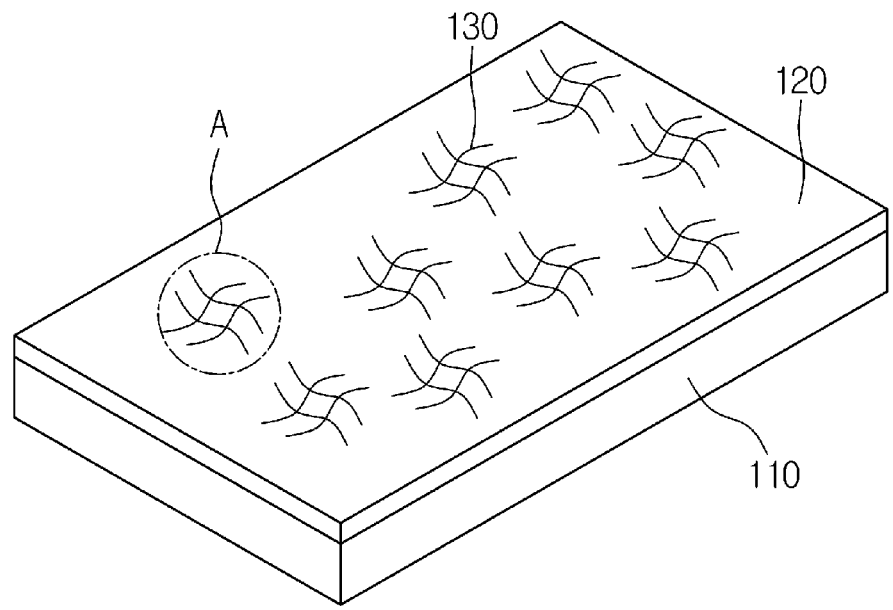
FIG. 3 is a sectional view showing the electrode structure according to the present embodiment.
Figure 4:
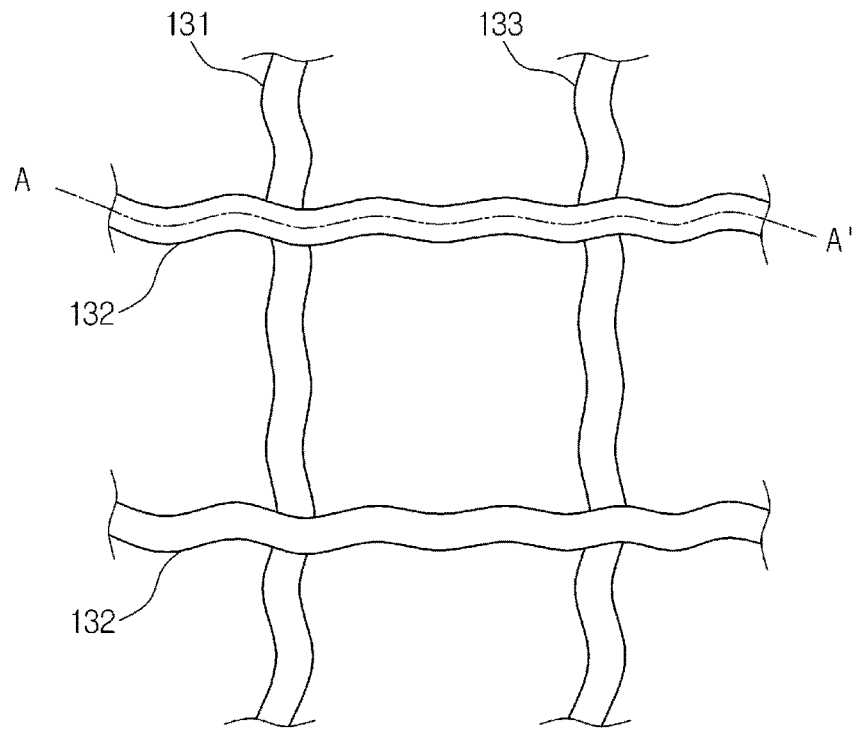
FIG. 4 is an enlarged view of a part A of FIG. 3 showing a wire.

Referring to FIGS. 2 to 4, the electrode structure according to the embodiment includes a substrate 110, a first wire 131 disposed on the substrate 110, and a second wire 132 disposed on the substrate. The first wire 131 crosses the second wire 132, and the first and second wires 131 and 132 are bonded to each other.

The first and second wires 131 and 132 are disposed in a preliminary electrode part 120 on the substrate. The first and second wires 131 and 132 may be directly disposed on the substrate or may be disposed on a different layer after the different layer has been deposited on the substrate.

Referring to FIG. 3, the preliminary electrode part 120 is disposed on the substrate 110, and a plurality of wires 130 are disposed in the preliminary electrode part 120. The wires 130 may cross each other.

The wires may have a diameter in the range of about 10 nm to about 200 nm. In addition, the wires 130 may have a length in the range of about 10 μm to about 100 μm.

Figure 5:
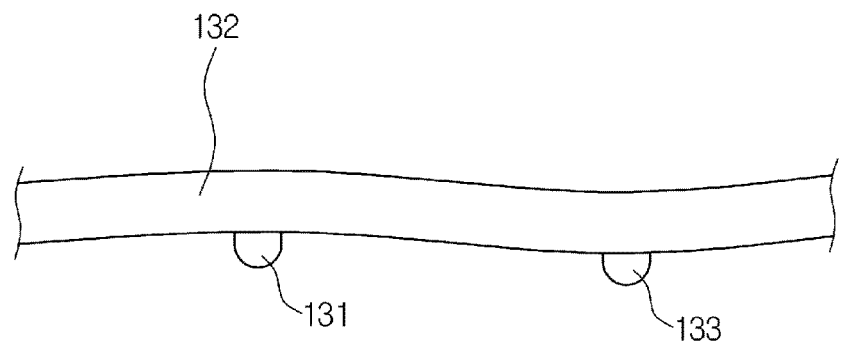
FIG. 5 is a sectional view taken along line A-A' of FIG. 4.

FIG. 4 is an enlarged view showing the wire of FIG. 3, and FIG. 5 is a sectional view taken along line A-A' of FIG. 4.

Referring to FIG. 4, the wires 130 may be provided in the form of a mesh in which the first wire 131, the second wire 132, a third wire 133, and a fourth wire 134 cross each other. In other words, the first and third wires 131 and 133 may cross the second and fourth wires 132 and 134.

As shown in FIG. 5, since the first to fourth wires 131 to 134 cross each other, the contact points between the wires 130 may be formed, and the surface resistance may be increased due to the contact points. Therefore, the electrical characteristics of the electrode structure can be remarkably reduced.

Figure 6:
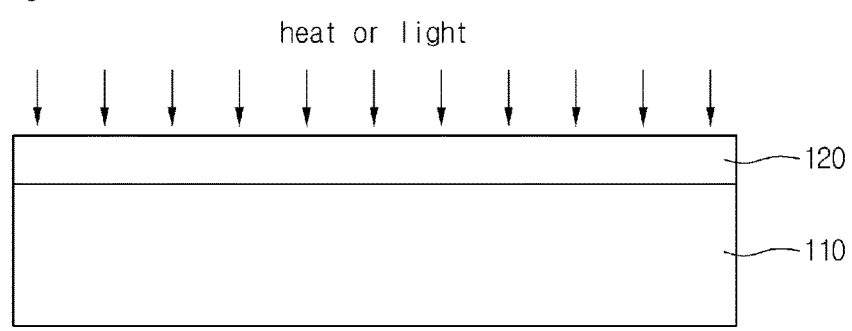
FIG. 6 is a plan view showing the electrode structure that is subject to light treatment or heat treatment according to the present embodiment.

Therefore, as shown in FIG. 6, in the electrode structure according to the present embodiment, the substrate 110 is subject to light treatment or heat treatment so that the first to fourth wires 131 to 134 can make contact with each other.

Figure 7:
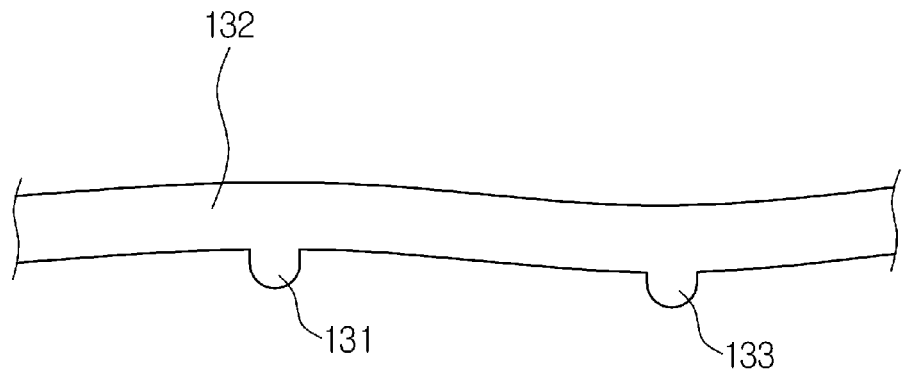
FIG. 7 is a sectional view a wire that has been subject to light treatment or heat treatment according to the present embodiment.

As shown in FIG. 7, if the substrate 110 is subject to the light treatment or the heat treatment, the wires crossing each other are bonded to each other so that the wires can be integrally formed with each other. In other words, if the substrate 110 is subject to the light treatment or the heat treatment, the first and third wires 131 and 133 crossing each other are bonded to the second wire 132 so that the first and third wires 131 and 133 can be integrally formed with the second wire 132.

Since the wires are bonded to each other at the cross section therebetween, so that the wires are integrally formed with each other, the surface resistance can be reduced. Accordingly, even if a small amount of wires are used, the surface resistance can be reduced, so that the electrical and optical characteristics can be improved. In other words, the electrode structure according to the present embodiment can represent high conductivity, high light transmittance, and low haze.

Hereinafter, several embodiments including an electrode structure having the wires 130 disposed therein will be described with reference to FIGS. 8 to 10.

Figure 8:
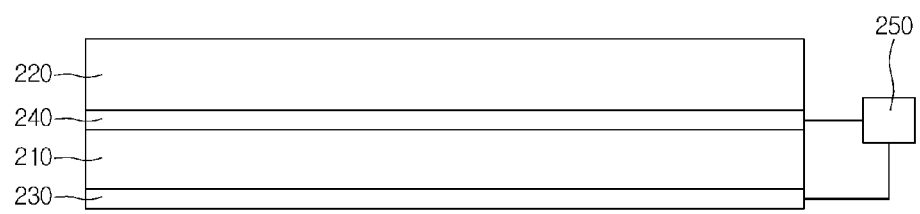
FIG. 8 is a schematic sectional view showing a touch panel according to a first embodiment.

FIG. 8 is a schematic sectional view showing a touch panel 200 including the wires 130 according to the first embodiment.

The touch panel 200 according to the first embodiment includes a first substrate 220, a first electrode 240 disposed on the first substrate 220, a second substrate 210 spaced apart from the first substrate 220, a second electrode 230 disposed on the second substrate 210, and a controller 250 connected to the first and second electrodes 240 and 230. The first electrode 240 or the second electrode 230 includes the first wire or the second wire crossing the first wire, and the first and second wires may be bonded to each other.

In this case, the first wire and the second wire may have a diameter in the range of 10 nm to 200 nm.

In addition, the touch panel may further include the third and fourth wires. The first wire is bonded to the second and fourth wires while crossing the second and fourth wires, and the second wire is bonded to the first and third wires while crossing the first and third wires.

Figure 9:
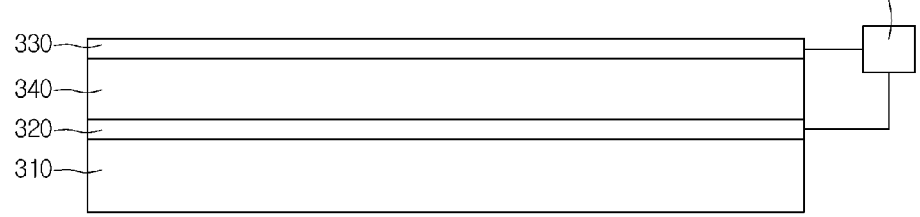
FIG. 9 is a schematic sectional view showing a solar cell according to a second embodiment.

FIG. 9 is a schematic sectional view showing a solar cell 300 including the wires 130 according to the second embodiment.

The solar cell 300 according to the second embodiment includes a substrate 310, a first electrode 320 disposed on the substrate 310, a second electrode 330 disposed on the substrate 310, a light absorbing layer 340 disposed on the first electrode 320, and a battery 350 connected to the first and second electrodes 320 and 330. The first electrode 320 or the second electrode 330 includes the first wire and the second wire. The first and second wires may be bonded to each other while crossing each other.

In this case, the first and second wires may have a diameter in the range of 10 nm to 200 nm.

In addition, the solar cell may further include the third and fourth wires. The first wire may be bonded to the second and fourth wires while crossing the second and fourth wires, and the second wire may be bonded to the first and third wires while crossing the first and third wires.

Figure 10:
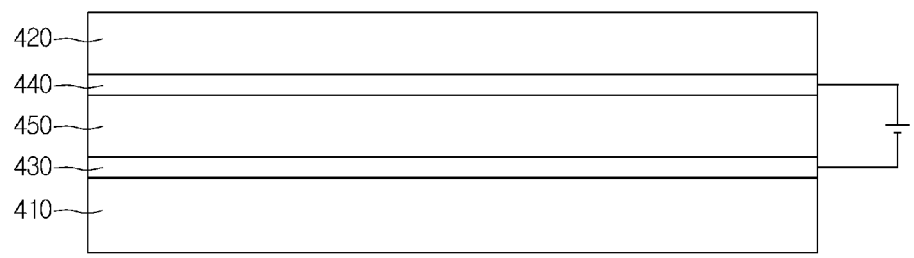
FIG. 10 is a schematic sectional view showing a liquid crystal display according to a third embodiment.

FIG. 10 is a schematic sectional view showing a liquid crystal display 400 including the wires 130 according to the third embodiment.

The liquid crystal display 400 according to the third embodiment includes a first substrate 410, a second substrate 420 spaced apart from the first substrate 410, a liquid crystal layer 450 interposed between the first and second substrates 410 and 420, a first electrode 430 disposed on the first substrate 410, and a second electrode 440 disposed on the second substrate 420. The first electrode 430 or the second electrode 440 includes first and second wires, and the first and second wires may be bonded to each other while crossing each other.

In this case, the first and second wires may have a diameter in the range of 10 nm to 200 nm.

In addition, the liquid crystal display may further include the third and fourth wires. The first wire may be bonded to the second and fourth wires while crossing the second and fourth wires, and the second wire may be bonded to the first and third wires while crossing the first and third wires.

The first electrode or the second electrode constituting the touch panel, the solar cell, and the liquid crystal display according to the embodiment includes the first wire and the second wire crossing the first wire, and the first wire may be bonded to the second wire.

Therefore, the same characteristics of the method for producing the electrode and the electrode structure according to the present embodiment are applicable to the touch panel, the solar cell, and the liquid crystal display. Therefore, devices such as the touch panel, the solar cell, and the liquid crystal display, which can improve the electrical characteristics and the optical characteristics of the electrode even if a small amount of wires are used, can be manufactured.

Hereinafter, the embodiment of the disclosure will be described in more detail. However, the embodiment is provided for the illustrative purpose, and the disclosure is not limited thereto.

Embodiment 1

The electrode material was prepared by dispersing the silver wire into the ethanol. In this case, 0.15 weight % of silver wire was contained with respect to the electrode material. After dipping a substrate into the electrode material, the substrate was subject to the dip coating scheme. The coated substrate had been dried at a temperature of about 80° C. for 10 minutes. After the substrate had been dried, light having energy of 5 J to 50 J was irradiated onto the transparent substrate by using the IPL. After the light had been irradiated onto the transparent substrate, the optical characteristics and the electrical characteristics of the transparent substrate had been measured.

Embodiment 2

The electrode material was prepared by dispersing the silver wire into the ethanol. In this case, 0.15 weight % of silver wire was contained with respect to the electrode material. After dipping a substrate into the electrode material, the substrate was subject to the dip coating scheme. The coated substrate had been dried at a temperature of about 80° C. for 10 minutes. After the substrate had been dried, the transparent substrate was put into a chamber filled with reduction gas, and heated at the temperature of 150° C. for 30 minutes. After the reduction-sintering had been completed, the optical characteristics and the electrical characteristics of the transparent substrate had been measured.

Comparative Example 1

The electrode material was prepared by dispersing the silver wire into the ethanol. In this case, 0.15 weight % of silver wire was contained with respect to the electrode material. After dipping a substrate into the electrode material, the substrate was subject to the dip coating scheme. The coated substrate had been dried at a temperature of about 80° C. for 10 minutes. The optical characteristics and the electrical characteristics of the dried transparent substrate had been measured.

TABLE 1

| | | Embodiment 1 | Embodiment 2 | Comparative Example 1 |
|---|---|---|---|---|
| Optical characteristics | TRANSMITTANCE | 90%~91% | 90%~91% | 90%~91% |
| | Haze | 0.8%~0.9% | 0.8%~0.9% | 0.8%~0.9% |
| Electrical characteristics | Surface resistance | 1000 Ω/☐~1200 Ω/☐ | 1500 Ω/☐~1800 Ω/☐ | 2300 Ω/☐~2500 Ω/☐ |

Referring to Table 1, the surface resistance of the substrate subject to the light treatment and the heat treatment according to the first and second embodiments is in the range of 1000Ω/☐ to 1800Ω/☐, which is lower than the surface resistance of the substrate according to the first comparative example. Therefore, the wires are bonded to each other through the light treatment or the heat treatment so that the wires can be integrally formed with each other. Accordingly, even if a small amount of wires are used, the same light transmittance can be obtained and electrical characteristics can be improved.

In other words, the electrode structure produced through the method for producing the electrode according to the embodiment can maintain high transmittance, and can represent a low reflective index, high conductivity, high light transmittance, and low haze. In addition, the electrode represents less surface resistance, so that the performance of the device including the electrode can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for producing an electrode, the method comprising:
   forming a plurality of silver nanowires;
   disposing the plurality of silver nanowires on a substrate; and
   bonding the silver nanowires of the plurality of silver nanowires to each other;
   wherein the plurality of silver nanowires comprises silver nanowires that are not electrically connected to each other and silver nanowires that are electrically connected to each other;
   wherein the plurality of silver nanowires comprises a first silver nanowire and a second silver nanowire that are bonded to each other and electrically connected to each other;
   wherein the bonding of the first and second silver nanowires to each other is performed by performing light treatment with respect to the substrate;
   wherein, by performing the light treatment, a contact point of the first and second silver nanowires is formed;
   wherein the first and second silver nanowires and the contact point are integrally formed;
   wherein the first silver nanowire, the second silver nanowire, and the contact point all comprise the same metal;
   wherein a thickness of the first silver nanowire at a region corresponding to the contact point is thicker than that of regions of the first silver nanowire other than the contact point; and
   wherein a thickness of the second silver nanowire at a region corresponding to the contact point is thicker than that of regions of the second silver nanowire other than the contact point.

2. The method of claim 1, wherein the first and second silver nanowires are bonded to cross each other.

3. The method of claim 1, wherein the disposing of the first and second silver nanowires on the substrate is performed by coating the first and second silver nanowires on the substrate and drying the coated substrate.

4. The method of claim 1, wherein light treatment is performed under energy of 5 J to 50 J.

5. The method of claim 1, further comprising disposing third and fourth silver nanowires on the substrate, wherein the first silver nanowire is bonded to the second and fourth silver nanowires while crossing the second and fourth silver nanowires, and the second silver nanowire is bonded to the first and third silver nanowires while crossing the first and third silver nanowires.

6. The method of claim 1, wherein the first and second silver nanowires have a diameter in a range of 10 nm to 200 nm, and have a length in a range of 10 μm to 100 μm.

7. An electrode structure comprising:
   a substrate; and
   a plurality of silver nanowires on the substrate,
   wherein the plurality of silver nanowires comprises silver nanowires that are not electrically connected to each other and silver nanowires that are electrically connected to each other,
   wherein a plurality of silver nanowires comprises a first silver nanowire and a second silver nanowire that are bonded to each other and electrically connected to each other,
   wherein the first silver nanowire crosses the second silver nanowire, and the first and second silver nanowires are bonded to each other in such a manner that the first and second silver nanowires are integrally formed with each other;
   wherein the bonding of the first and second silver nanowires to each other is performed by performing light treatment with respect to the substrate;
   wherein, by performing the light treatment, a contact point of the first and second silver nanowires is formed;
   wherein the first and second silver nanowires and the contact point are integrally formed;
   wherein a thickness of the first silver nanowire at a region corresponding to the contact point is thicker than that of regions of the first silver nanowire other than the contact point; and
   wherein a thickness of the second silver nanowire at a region corresponding to the contact point is thicker than that of regions of the second silver nanowire other than the contact point.

8. The electrode structure of claim 7, wherein the first and second silver nanowires have a diameter in a range of 10 nm to 200 nm, and have a length in a range of 10 μm to 100 μm.

9. The electrode structure of claim 7, further comprising third and fourth silver nanowires, wherein the first silver nanowire is bonded to the second and fourth silver nanowires while crossing the second and fourth silver nanowires, and the second silver nanowire is bonded to the first and third silver nanowires while crossing the first and third silver nanowires.

10. A touch panel comprising:
    a first substrate;
    a first electrode disposed on the first substrate;
    a second substrate spaced apart from the first substrate;
    a second electrode disposed on the second substrate; and
    a controller connected to the first and second electrodes;
    wherein the first electrode or the second electrode comprises a plurality of silver nanowires,
    wherein the plurality of silver nanowires comprises silver nanowires that are not electrically connected to each other and silver nanowires that are electrically connected to each other,
    wherein the plurality of silver nanowires comprises a first silver nanowire and a second silver nanowire that are bonded to each other and electrically connected to each other,
    wherein the first silver nanowire crosses the second silver nanowire, and the first and second silver nanowires are bonded to each other in such a manner that the first and second silver nanowires are integrally formed with each other;

wherein the bonding of the first and second silver nanowires to each other is performed by performing light treatment with respect to the substrate;

wherein, by performing the light treatment, a contact point of the first and second silver nanowires is formed;

wherein the first and second silver nanowires and the contact point are integrally formed;

wherein a thickness of the first silver nanowire at a region corresponding to the contact point is thicker than that of regions of the first silver nanowire other than the contact point; and wherein a thickness of the second silver nanowire at a region corresponding to the contact point is thicker than that of regions of the second silver nanowire other than the contact point.

11. The touch panel of claim 10, wherein the first and second silver nanowires have a diameter in a range of 10 nm to 200 nm, and have a length in a range of 10 μm to 100 μm.

12. The touch panel of claim 10, further comprising third and fourth silver nanowires, wherein the first silver nanowire is bonded to the second and fourth silver nanowires while crossing the second and fourth silver nanowires, and the second silver nanowire is bonded to the first and third silver nanowires while crossing the first and third silver nanowires.

* * * * *